United States Patent [19]
Ohmi

[11] Patent Number: 5,863,842
[45] Date of Patent: Jan. 26, 1999

[54] VACUUM EXHAUSTING APPARATUS, SEMICONDUCTOR MANUFACTURING APPARATUS, AND VACUUM PROCESSING METHOD

[76] Inventor: Tadahiro Ohmi, 1-17-301, Komegabukuro 2-chome, Aoba-ku, Sendai-shi, Miyagi-ken, Japan

[21] Appl. No.: 655,318

[22] Filed: May 24, 1996

[30] Foreign Application Priority Data

May 25, 1995 [JP] Japan .................................. 7-126271

[51] Int. Cl.$^6$ .................................................. C23C 16/00

[52] U.S. Cl. ......................... 438/758; 427/294; 438/758; 118/715; 118/50

[58] Field of Search .................. 118/715, 50; 427/248.1, 427/294; 438/758

[56] References Cited

U.S. PATENT DOCUMENTS 5,079,031  1/1992  Yamazaki ................................ 118/715

*Primary Examiner*—Richard Bueker
*Attorney, Agent, or Firm*—Randall J. Knuth

[57] ABSTRACT

A vacuum exhausting apparatus, a semiconductor manufacturing apparatus, and a vacuum processing method in which high performance semiconductor device can be manufactured with high stability and high yield. The present invention comprises a turbo-molecular pump and an auxiliary pump connected to an exhaust side of the turbo-molecular pump, and provides a gas introducing section for introducing a specified gas into an area between the turbo-molecular pump and the auxiliary pump, in which gas inside the vacuum chamber is exhausted while a specified gas is being introduced thereinto from the introducing section.

9 Claims, 6 Drawing Sheets

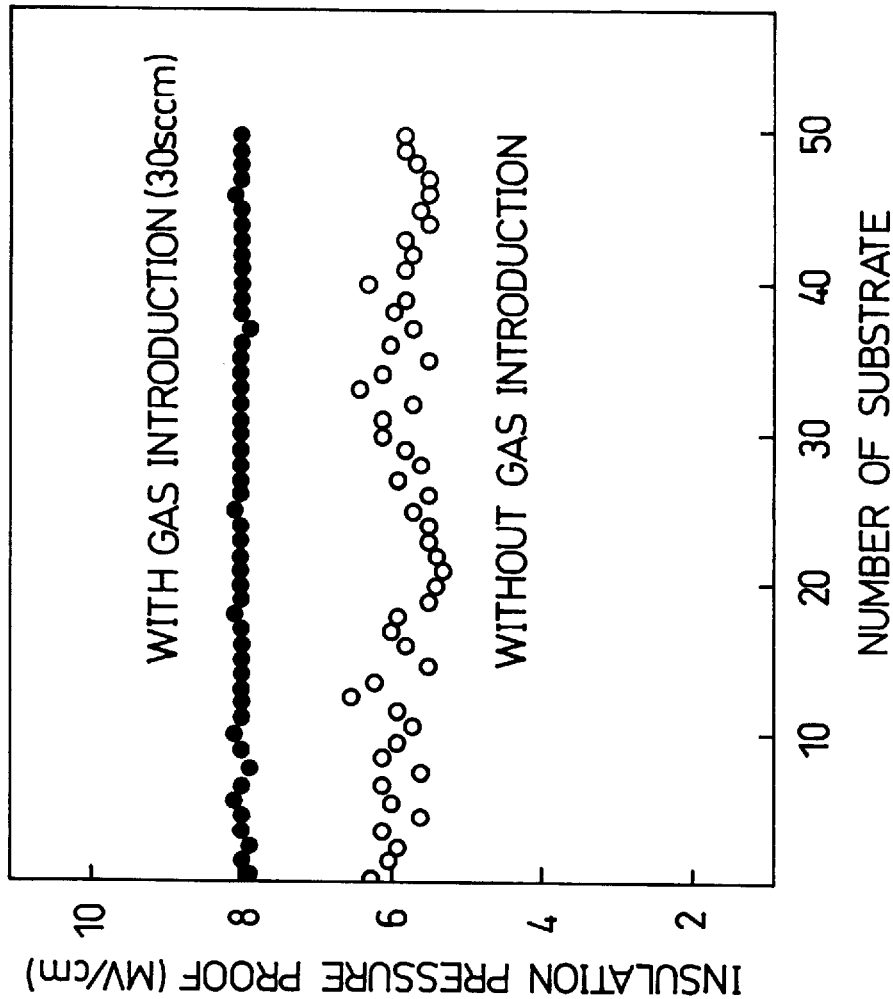

VACUUM EXHAUSTING APPARATUS, SEMICONDUCTOR MANUFACTURING APPARATUS, AND VACUUM PROCESSING METHOD

TECHNOLOGICAL FIELD

The present invention relates to a vacuum exhausting apparatus, a semiconductor manufacturing apparatus, and a vacuum processing method, and more particularly, relates to a manufacturing apparatus for stably forming a high-performance semiconductor device on a semiconductor substrate, a glass substrate, or a plastic substrate or the like.

BACKGROUND ART

The present inventor has found, in a process of searching for a method of manufacturing a semiconductor with the aim to realize a semiconductor device with a higher performance as well as to improve the production yield of semiconductors, that, in a case where a turbo-molecular pump is used for an exhaust system, for instance, when a thin film constituting a semiconductor device is formed, some impurities are mixed in the thin film, which prevents improvement of characteristics of the semiconductor device even in a case where a ultra-purity gas is used as a process gas and sufficient attention is paired to prevent impurities from being mixed therein by using a vacuum processing chamber having a surface enabling suppression of degassing.

As a result of streneous efforts for analyzing this cause, it was found that gas molecules exhausted once from an exhaust side of the turbo-molecular pump into the vacuum processing chamber for manufacturing a thin film or impurity gasses existing in the exhaust side of the turbo-molecular pump, is reversely diffused, and the gasses or the like are mixed into a thin film during formation thereof. Namely, it is found that, to achieve higher performance of a semiconductor device and a high production yield, a vacuum exhaust system preventing reverse diffusion of the impurities or the like is required.

The present invention has been made according to the obtained knowledge described above, and it is an object of the present invention to provide a vacuum exhausting apparatus, a semiconductor manufacturing apparatus, and a vacuum processing method, which enable production of high-performance semiconductor devices with stability and high yield.

DISCLOSURE OF THE INVENTION

The vacuum exhausting apparatus according to the present invention is an exhausting apparatus for exhausting a gas or the like from inside of a vacuum chamber, comprises a turbo-molecular pump and an auxiliary pump connected to an exhaust side of the turbo-molecular pump, provides a gas introducing section for introducing a specified gas into an area between the turbo-molecular pump and the auxiliary pump, and exhausts a gas or the like from inside of the vacuum chamber while introducing the specified gas from the introducing section.

The semiconductor manufacturing apparatus according to the present invention comprises at least a vacuum chamber and a vacuum exhausting apparatus connected to the vacuum chamber according to the present invention, and a substrate is processed in the vacuum chamber.

The vacuum processing method according to the present invention is one in which a substrate is processed in the vacuum chamber while a gas or the like is exhausted from inside of the vacuum chamber with a turbo-molecular pump and an auxiliary pump connected to an exhaust side of the turbo-molecular pump, and is characterized in that a specified gas is introduced into an area between the turbo-molecular pump and the auxiliary pump, and that reverse diffusion of a gas or the like from the exhaust side of the turbo-molecular pump to a suction side thereof is prevented.

As the specified gas, an inert gas, or a gas fed to the vacuum chamber or a partial element of the gas, or a mixed gas of these gases and an inert gas is preferable. Also a flow rate of the specified gas is preferably set to not more than 10% of the flow rate of gas fed to the vacuum chamber.

It is preferable that the vacuum chamber and a connecting member each have a chromium oxide passivated film or a fluoride-passivated film formed on the internal side thereof.

FUNCTION

Description is made for function of the present invention with reference to experiments carried out with a sputtering apparatus as an example of the semiconductor manufacturing apparatus according to the present invention shown in FIG. 1.

In FIG. 1, the reference numeral 101 indicates a vacuum chamber of which an internal surface has been subjected to a chromium oxide passivation and for forming a film with a sputter, and a rate of discharged moisture is around $1 \times 10^{-7}$ Torr·L/sec. The vacuum chamber 101 is connected to a suction side of the turbo-molecular pump 103 through a piping 102, and an exhaust side of the pump 103 is connected to a roughing vacuum pump 105 through a flexible piping 104. Also, a process gas is fed to the vacuum chamber 101 through a mass-flow controller 110, and furthermore a piping 106, a needle valve 107, a quadrupole mass spectrometer 108, and a roughing vacuum pump 109 each are connected thereto, and mass spectrometry of a gas in the vacuum chamber 101 can be carried out.

An introducing section 114 for introducing a specified gas is provided at the exhaust side of the turbo-molecular pump 103, and the specified gas is introduced thereinto through a mass-flow controller 111.

A high frequency power from a high frequency power source 112 through a matching box 113 is loaded to an electrode (not shown herein) in the vacuum chamber 101, whereby plasma is generated therein.

By using the sputtering apparatus shown in FIG. 1, an Ar gas having a moisture density of 1 ppb is fed to the vacuum chamber 101 as a process gas (a gas fed to the vacuum chamber) through the mass-flow controller 110, and FIG. 2 shows a result of measurement of a density of $H_2O$ in the vacuum chamber with the quadrupole mass spectrometer when air has been exhausted by using roughing vacuum pumps having various exhausting capabilities.

As shown in FIG. 2, although a density of $H_2O$ varies according to a flow rate of Ar or to an exhausting speed of the roughing vacuum pump, it was found that quite a large quantity of moisture is contained in the process gas atmosphere. It is conceivable that the moisture discharged from the flexible piping 104 at the exhaust side of turbo-molecular pump was diffused in the reverse direction.

Next, FIG. 3 shows a result of measurement of a density of $H_2O$ in the vacuum chamber when an Ar gas having a moisture density of 1 ppb is fed to the vacuum chamber 101 as a process gas while a $N_2$ gas is introduced thereto from the introducing section 114 for a specified gas provided at the exhaust side of the turbo-molecular pump through the mass-flow controller 111. As compared to data shown in FIG. 2, it is understood that the density of $H_2O$ is greatly reduced by feeding a $N_2$ gas to the exhaust side of the turbo-molecular pump 111, and furthermore a flow rate of a $N_2$ gas is set to around 10% of a flow rate of a process gas, whereby the density of $H_2O$ is reduced to as less as around 10 ppb, which allows inside of the vacuum chamber to be filled with an extremely clean atmosphere.

The reason why the result described above can be obtained is not clear at present, but it may be considered as follows. Namely, it may be considered that, by introducing an inert gas into an area between the turbo-molecular pump and the auxiliary pump, an area between the exhaust side of the turbo-molecular pump and the auxiliary pump is changed from a molecular flow area to a viscous flow area, and process gas molecules having been exhausted once to outside of the vacuum chamber with the turbo-molecular pump are moved as they are with the viscous flow and exhausted with the auxiliary pump, and for this reason the reverse diffusion of the gas is hard to be generated.

When a possibility of reverse diffusion of a small quantity of gas into the vacuum chamber is taken into consideration even it, a specified gas is reversely diffused, the effects over processing in the vacuum chamber can be suppressed to the minimum level, so that it is preferable to use an inert gas, or a gas contained in the process gas, or a mixed gas of these gases. It should be noted that Ar and $N_2$ gases are preferably used as an inert gas. Furthermore, it is preferable that a chromium oxide passivated film or a fluoride-passivated film, each having a small quantity of moisture absorption and excellent desorption characteristics, is formed on the internal surface of a connecting member (e.g. piping) between a turbo-molecular pump and an auxiliary pump.

Furthermore, a density of impurities in the specified gas is preferably 1 ppm or less, and more preferably 1 ppb or less, but it is needless to say that a purity less than the value of this purity may be used depending on a purity of a process gas, performance of a semiconductor device, or a purpose of its use. A rate of introducing a specified gas is preferably 10% or less of the flow rate of process gas. Because, if the flow rate of gas exceeds 10% of the flow rate of process gas, the sufficient exhaust characteristics of a turbo-molecular pump can not be obtained. It may be considered as the reason that a pressure at the exhaust side of the turbo-molecular pump is raised while a compression ratio thereof is decreased.

In the present invention, an introducing section for a specified gas may be provided at an exhaust port section of a turbo-molecular pump as described above, or may be provided on a connecting member (e.g. piping or the like) between the turbo-molecular pump and an auxiliary pump.

It is preferable to form a chromium oxide passivated film or a fluoride-passivated film on an internal surface of not only the connecting member but also of the vacuum chamber or other pipings or the like to manufacture a higher-performance semiconductor device.

It should be noted that the vacuum exhausting apparatus and the vacuum processing method according to the present invention are preferably applicable to a various types of vacuum-related apparatus including analyzing apparatuses such as an AES and an SIMS, to formation of a film on metal, a semiconductor, or insulation material, and to process of the surface thereof other than to apparatuses for sputtering, vacuum vapor deposition, dry etching, and ion-implantation and other semiconductor manufacturing apparatuses.

BRIEF DESCRIPTION OF THE DRAWINGS

FIG. 6 is a graph showing the dispersion of insulation pressure proof.

DESCRIPTION OF THE REFERENCE NUMERALS)

Figure 1:
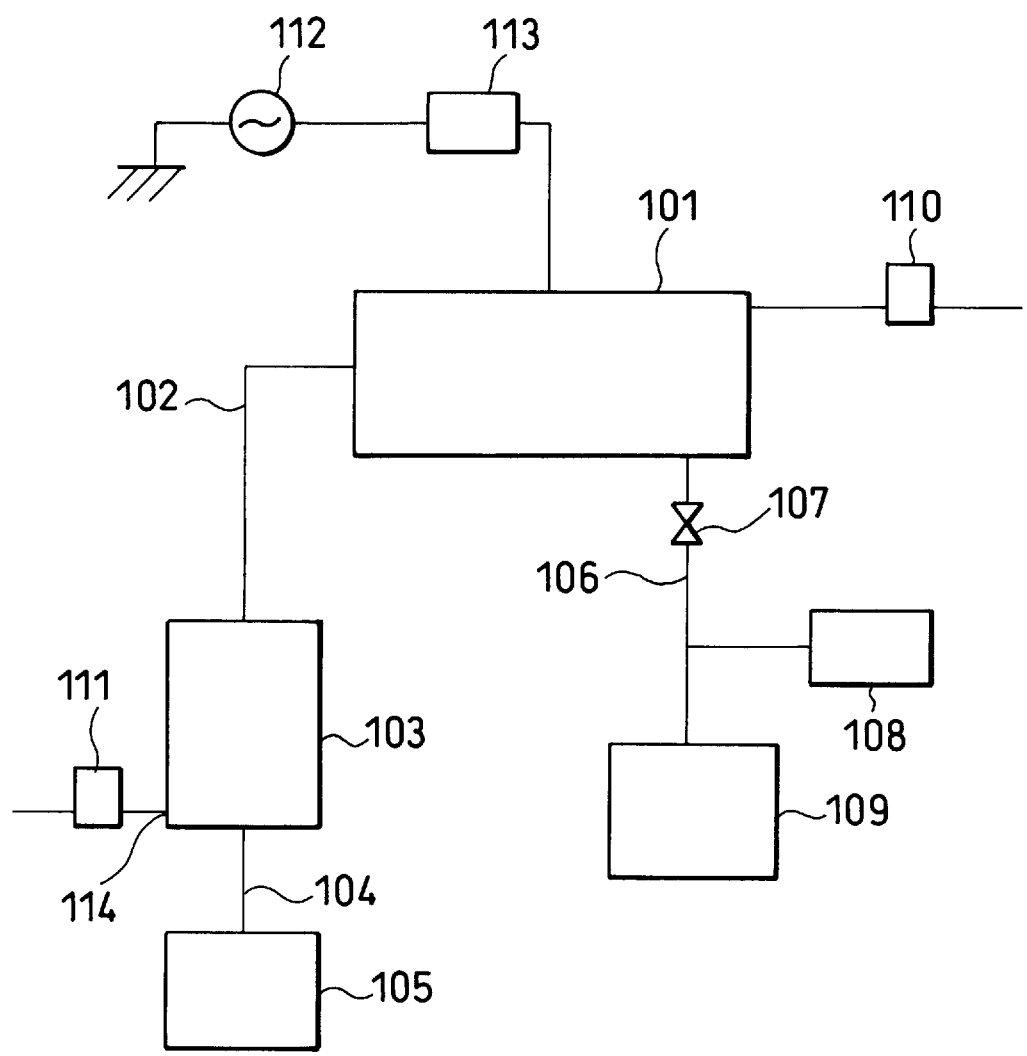
FIG. 1 is a concept diagram of a sputtering apparatus showing an example of the semiconductor manufacturing apparatus according to the present invention.
Figure 2:
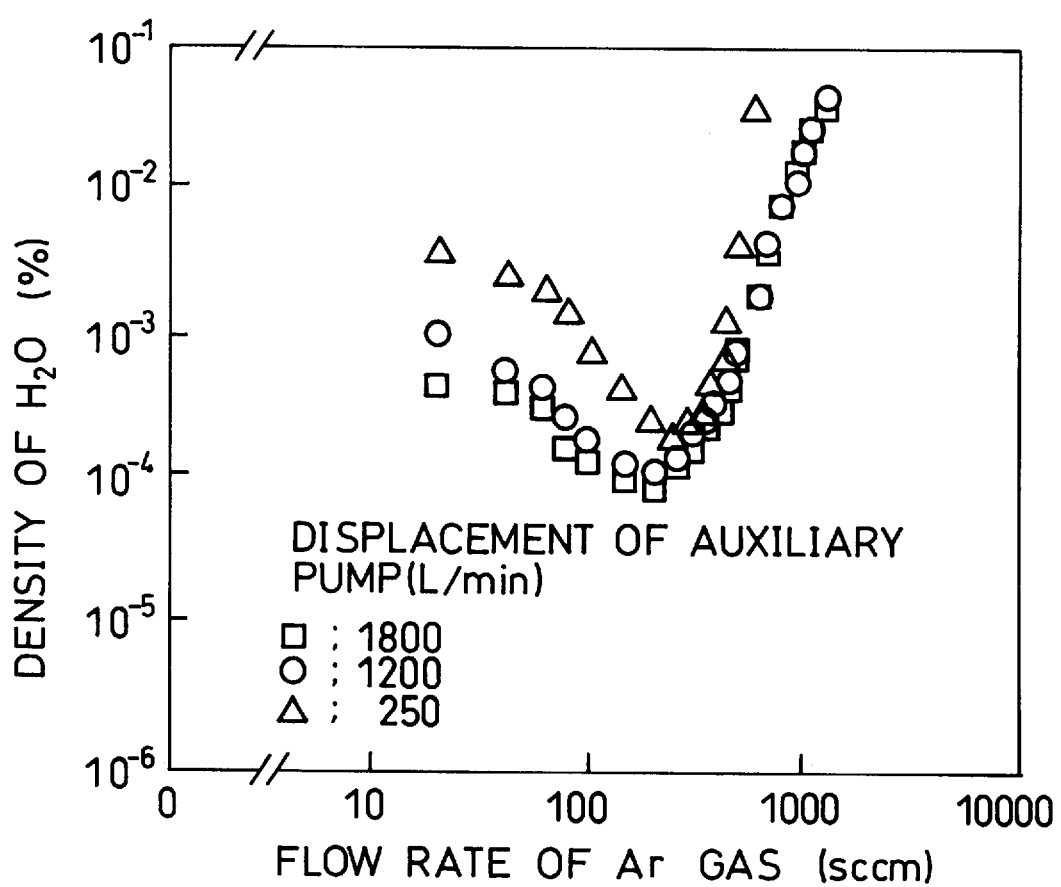
FIG. 2 is a graph showing a flow rate of a gas fed to a vacuum chamber and a density of $H_2O$.
Figure 3:
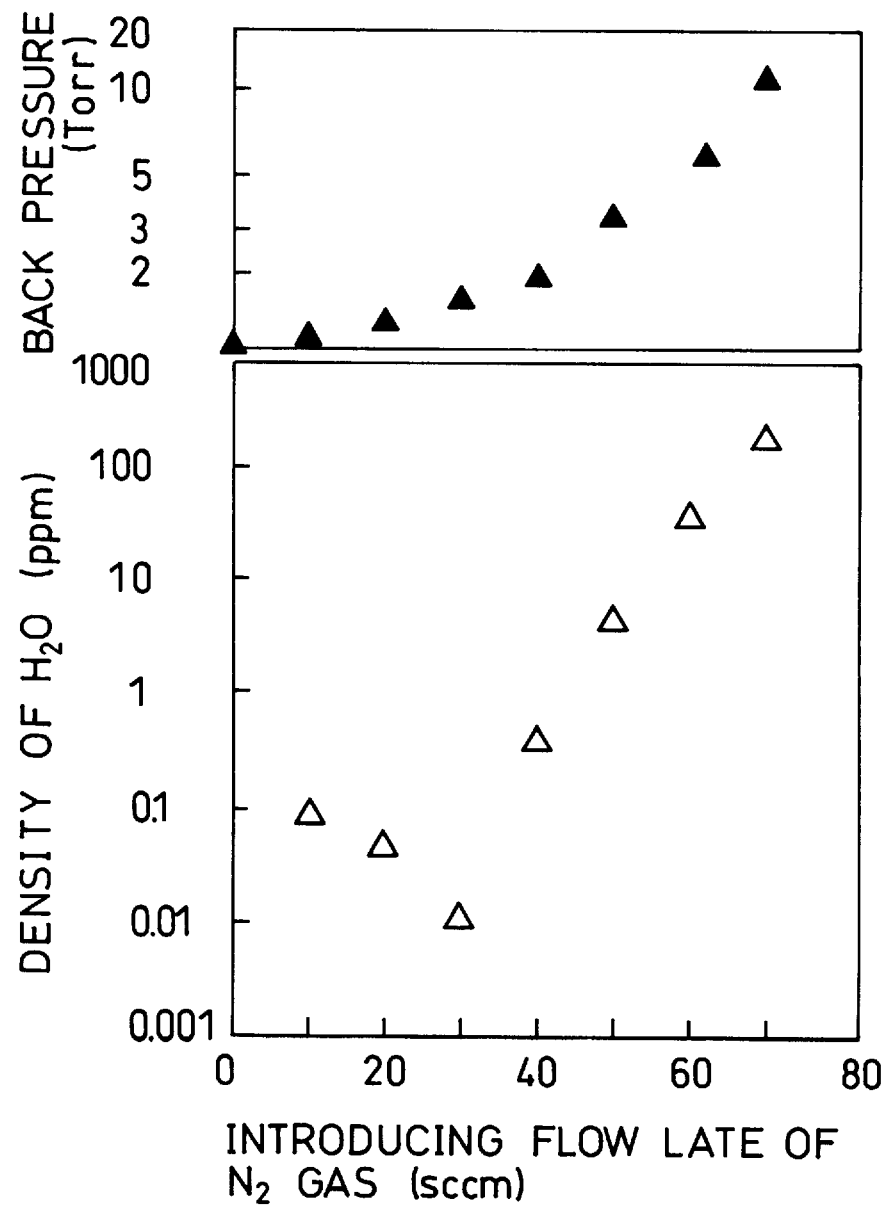
FIG. 3 is a graph showing a relation between a density of $H_2O$ in the vacuum chamber and a flow rate of a specified gas introduced to an exhaust side of a turbo-molecular pump.

101 vacuum chamber
102 piping
103 turbo-molecular pump
104 flexible piping
105 roughing vacuum pump
106 piping
107 needle valve
108 quadrupole mass spectrometer
109 roughing vacuum pump
110, 111 mass-flow controller
112 high-frequency power source
113 matching box
114 introducing section for a specified gas

BEST MODE FOR CARRYING OUT THE PRESENT INVENTION

More detailed description is made hereinafter for the present invention with reference to some embodiments thereof, however the present invention is not limited to the embodiments.

(Embodiment 1)

In the present embodiment, an Al film was formed by using a sputtering apparatus shown in FIG. 1, and an evaluation of the film was performed.

A silicon substrate is placed on a substrate electrode (not shown herein) in the sputter chamber (vacuum chamber) shown in FIG. 1, and air in the chamber was exhausted to as less as $10^{-8}$ Torr. An Ar gas having a moisture density of not more than 1 ppb was introduced to the chamber by 200 sccm through a mass-flow 110, the pressure in the chamber was set to 10 m Torr, a high-frequency power was loaded thereto, and an Al fil was formed with a thickness of around 100 nm. At the same time, a moisture density in the atmosphere for forming films was measured with the quadrupole mass spectrometer.

Figure 4:
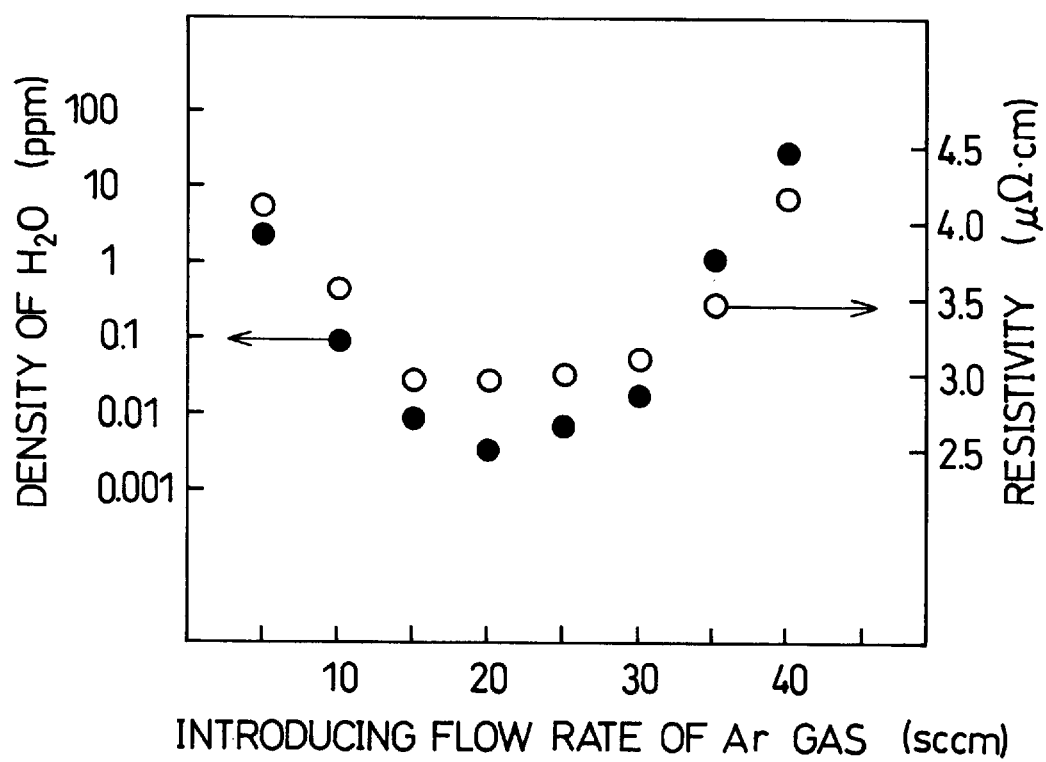
FIG. 4 is a graph showing a relation between a resistivity of Al and a flow rate of an Ar gas introduced to the exhaust side of the turbo-molecular pump.

Conditions of forming films were kept constant, a specified gas (Ar) was introduced by 0 to 50 sccm through the mass-flow controller 111, and a relation between a flow rate of introducing an Ar gas and a moisture rate as well as a resistivity of Al in the chamber during the introduction was checked. FIG. 4 shows a result of checking the relation. In FIG. 4, an X-axis indicates a flow rate of Ar introduced from a mass-flow controller 111, a Y-axis indicates a quantity of moisture in the chamber and a specific resistance of an Al film. As clearly understood from the figure, it is found that a moisture quantity and a specific resistance are reduced in association with increase of a flow rate of an Ar gas, and become minimum when the flow rate of an Ar gas reaches 1/10 (20 sccm) of that of an Ar gas introduced into the chamber, and furthermore when a flow rate of an Ar gas introduced from the mass-flow controller 111 is increased, both of the moisture rate and specific resistance increase.

As a result of measurement of a quantity of oxygen with the SIMS (secondary ion mass spectrometer), it is recognized that changes of a density of oxygen are identical to those of the specific resistance, and the density of oxygen becomes minimum when the flow rate of Ar reaches 20 sccm.

As clearly understood from the results of experiments described above, it is understood that a high-quality thin film can be formed by feeding a gas into an area between the exhaust side of a turbo-molecular pump and an auxiliary pump.

(Embodiment 2)

In the present embodiment, a silicon nitride film was grown by using a plasma CVD apparatus having the same configuration as that shown in FIG. 1, and then the pressure proof characteristics were checked.

A glass substrate with a metal electrode formed thereon is used as a substrate, and a $SiH_4$ gas at a flow rate of 100 sccm, $NH_3$ at 200 sccm, and $N_2$ at 200 sccm are introduced into the chamber under the temperature of substrate of 300° C. through the mass-flow controller. Pressure is set to 100 Pa, and a high-frequency power is loaded to the chamber for depositing thereon a silicon nitride film having a thickness of 200 nm.

Figure 5:
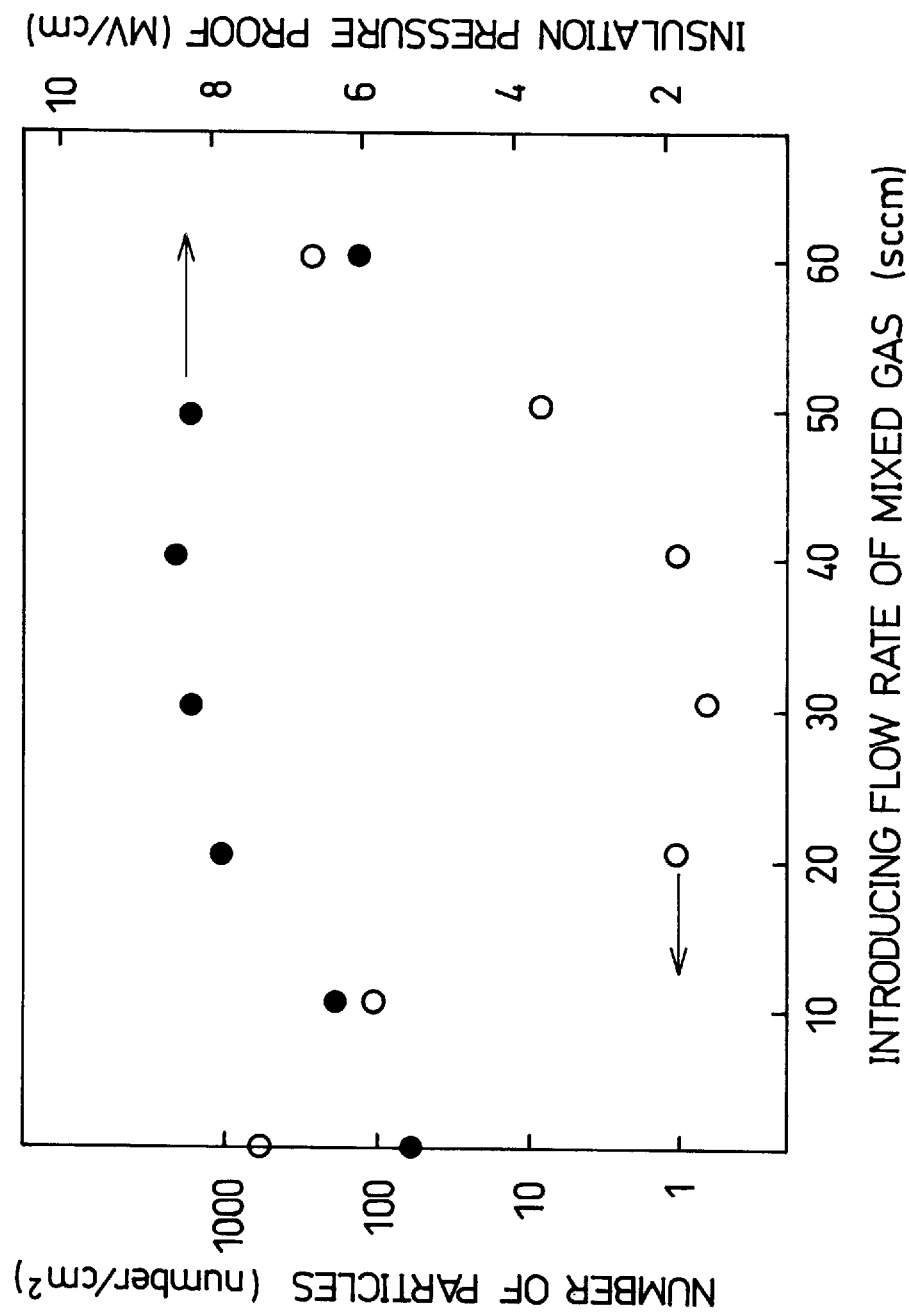
FIG. 5 is a graph showing a relation between an insulation pressure proof of a silicon nitride film and a flow rate of an Ar gas introduced to the exhaust side of the turbo-molecular pump.

The conditions for forming a film were kept constant, and a mixed gas of SiH4, NH3, N2 was introduced into an area between the turbo-molecular pump and the auxiliary pump with a total flow rate of 0 to 70 sccm while a ratio of 1:2:2 which was a ratio of each flow rate of the gases introduced into the chamber was maintained, and insulation voltage resistance of the formed silicon nitride film and a number of particles each having a size of not less than 0.3 $\mu$m deposited on the substrate were checked. FIG. 5 shows a result of the experiments.

It is found that, when a total flow rate of the mixed gas is introduced at the total flow rate of 30 sccm to the exhaust side of turbo-molecular pump, the total number of particles deposited thereon becomes minimum, and the insulation voltage resistance becomes maximum. The reason is considered that reaction products generated when $SiH_4$ and $NH_3$ are decomposed in plasma are not reversely diffused back into the chamber so that the products are completely exhausted by introducing gases into the exhaust port side of the turbo-molecular pump.

Next, 50 sheets of films were continuously formed under the identical conditions both in a case where gases were not introduced thereinto and in a case where gasses were introduced thereinto at the flow rate at 30 sccm, the optimal value, and dispersion of insulation voltage resistance was checked in each of the cases. FIG. 6 shows a result of the experiments. As shown in FIG. 6, it is understood that the dispersion of the insulation voltage resistance in a case where the gasses are not introduced is ±10%, while that in a case where 30 sccm is introduced is suppressed to ±2%, indicating that the average voltage resistance can be made higher.

INDUSTRIAL APPLICABILITY

With the present invention, it is possible to remarkably enhance cleanness of a vacuum chamber, and as a result, higher-precision vacuum processing can be achieved, which makes it possible to provide high-stability and high-yield semiconductors.

I claim:

1. A vacuum exhausting apparatus which is an exhausting apparatus for exhausting gas inside vacuum chamber, comprising a turbo-molecular pump and an auxiliary pump connected to an exhaust side of said turbo-molecular pump; wherein a gas introducing section for introducing a specified gas into an area is provided between said turbo-molecular pump and said auxiliary pump, and gas inside said vacuum chamber is exhausted while the specified gas is introduced thereinto from said introducing section.

2. A vacuum exhausting apparatus according to claim 1, wherein a chromium oxide passivated film or a fluoride-passivated film is formed on an internal surface of a connecting member used for connection between said turbo-molecular pump and said auxiliary pump.

3. A vacuum exhausting apparatus according to claim 1 and claim 2, wherein said specified gas is an inert gas, or a gas fed to said vacuum chamber, or a partial element of the gas, or a mixed gas of these gases and an inert gas.

4. A vacuum exhausting apparatus according to claim 3, wherein a flow rate of said specified gas is 10% or less of the flow rate of gas fed to said vacuum chamber.

5. A semiconductor manufacturing apparatus having at least a vacuum chamber and a vacuum exhausting apparatus according to any of claims 1 through 4, wherein a substrate is processed in said vacuum chamber.

6. A semiconductor manufacturing apparatus according to claim 5, wherein a chromium oxide passivated film or a fluoride-passivated film is formed on an internal surface of said vacuum chamber.

7. A vacuum processing method for processing a substrate in a vacuum chamber while gas inside said vacuum chamber is exhausted with a turbo-molecular pump and an auxiliary pump connected to an exhaust side of said turbo-molecular pump, wherein a specified gas is introduced into an area between said turbo-molecular pump and said auxiliary pump, so that reverse diffusion of the gas from the exhaust side of said turbo-molecular pump to a suction side thereof can be prevented.

8. A vacuum processing method according to claim 7, wherein said specified gas is an inert gas, or a gas fed to said vacuum chamber, or a partial element of the gas, or a mixed gas of these gases and an inert gas.

9. A vacuum processing method according to claim 8, wherein a flow rate of said specified gas is 10% or less of the flow rate of gas fed to said vacuum chamber.

* * * * *